(12) United States Patent
Park

(10) Patent No.: US 10,275,178 B2
(45) Date of Patent: Apr. 30, 2019

(54) ELECTRONIC DEVICE INCLUDING SEMICONDUCTOR MEMORY HAVING DIFFERENT DISTANCES BETWEEN SWITCHING ELEMENTS AND VARIABLE RESISTANCE ELEMENTS

(71) Applicant: SK hynix Inc., Icheon (KR)

(72) Inventor: Nam-Kyun Park, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/723,659

(22) Filed: Oct. 3, 2017

(65) Prior Publication Data
US 2018/0267743 A1 Sep. 20, 2018

(30) Foreign Application Priority Data
Mar. 17, 2017 (KR) .................. 10-2017-0033553

(51) Int. Cl.
| | | |
|---|---|---|
| G11C 8/00 | (2006.01) | |
| G06F 3/06 | (2006.01) | |
| H01L 45/00 | (2006.01) | |
| G06F 12/08 | (2016.01) | |
| G11C 11/16 | (2006.01) | |
| H01L 27/115 | (2017.01) | |
| G06F 12/0875 | (2016.01) | |
| H01L 27/24 | (2006.01) | |

(52) U.S. Cl.
CPC .......... *G06F 3/0656* (2013.01); *G06F 3/0602* (2013.01); *G06F 3/0679* (2013.01); *G06F 12/08* (2013.01); *G06F 12/0875* (2013.01); *G11C 11/1655* (2013.01); *H01L 27/115* (2013.01); *H01L 27/24* (2013.01); *H01L 45/124* (2013.01); *H01L 45/146* (2013.01); *H01L 45/149* (2013.01); *H01L 45/1633* (2013.01); *G11C 2213/79* (2013.01)

(58) Field of Classification Search
CPC .. G11C 11/1655; G11C 11/16; G11C 11/5614
USPC ................................ 365/230.05, 148, 189.2
See application file for complete search history.

(56) References Cited

U.S. PATENT DOCUMENTS

| | | | |
|---|---|---|---|
| 8,526,237 B2 | 9/2013 | Samachisa et al. | |
| 2003/0086286 A1* | 5/2003 | Kang ...................... | G11C 11/22 365/145 |
| 2017/0117042 A1* | 4/2017 | Lee ........................ | G11C 16/26 |

* cited by examiner

*Primary Examiner* — Tha-O H Bui
*Assistant Examiner* — Alfredo Bermudez Lozada

(57) ABSTRACT

An electronic device includes a semiconductor memory. The semiconductor memory includes a first variable resistance element, a first switching element coupled to the first variable resistance element via a first line, a second variable resistance element, and a second switching element coupled to the second variable resistance element via a second line, wherein a distance between the first switching element and the first variable resistance element is larger than a distance between the second switching element and the second variable resistance element, and wherein a second path from a first terminal of the second switching element to the second variable resistance element includes a resistance component, a resistance of the second path being greater than a resistance of a first path, the first path being from a first terminal of the first switching element to the first variable resistance element.

19 Claims, 10 Drawing Sheets

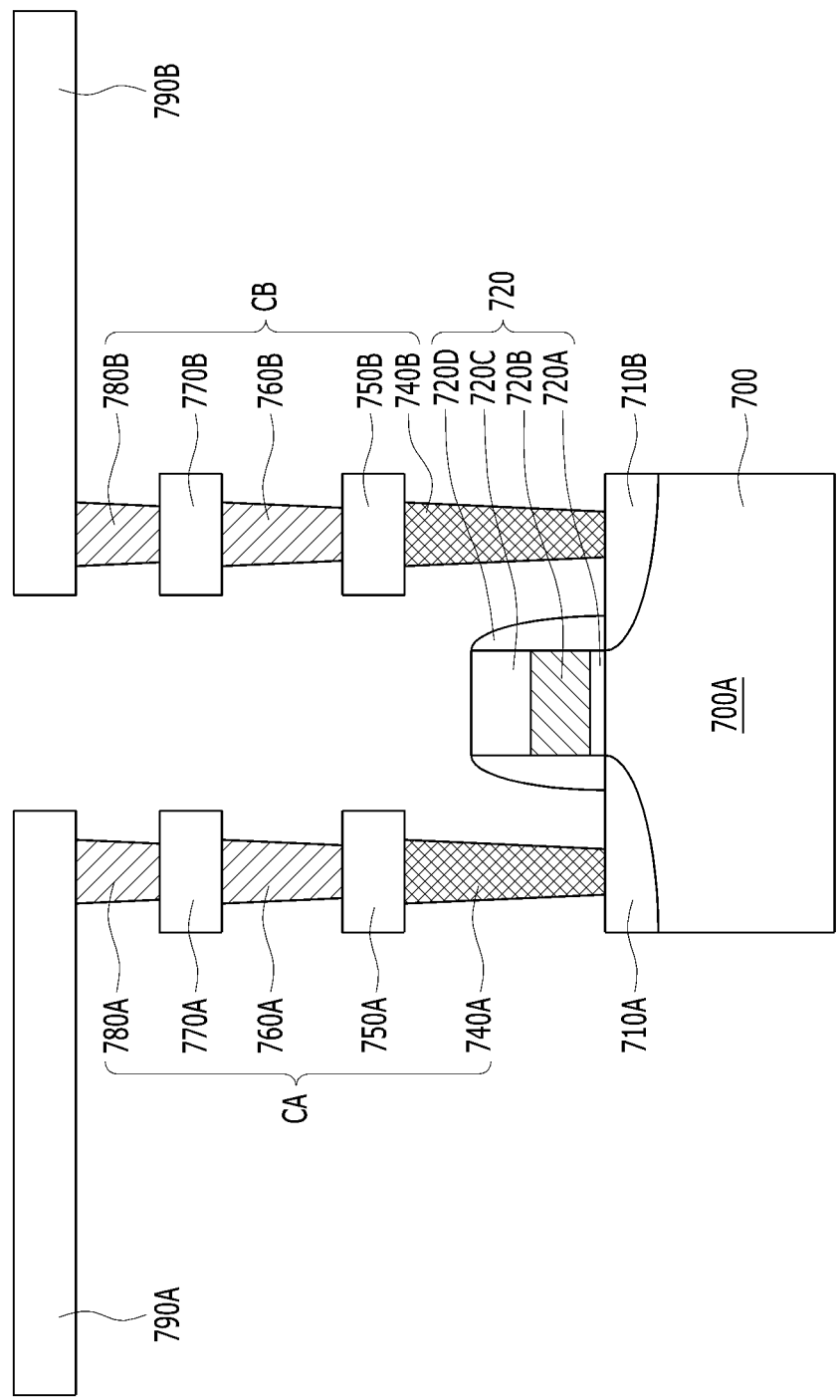

ELECTRONIC DEVICE INCLUDING SEMICONDUCTOR MEMORY HAVING DIFFERENT DISTANCES BETWEEN SWITCHING ELEMENTS AND VARIABLE RESISTANCE ELEMENTS

CROSS-REFERENCE TO RELATED APPLICATIONS

The present application claims priority to Korean Patent Application No. 10-2017-0033553, filed on Mar. 17, 2017, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on, have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a semiconductor memory being capable of securing operating characteristics.

In an implementation, an electronic device includes a semiconductor memory, and the semiconductor memory includes: a first variable resistance element; a first switching element coupled to the first variable resistance element via a first line; a second variable resistance element; and a second switching element coupled to the second variable resistance element via a second line, wherein a distance between the first switching element and the first variable resistance element is larger than a distance between the second switching element and the second variable resistance element, and wherein a second path from a first terminal of the second switching element to the second variable resistance element includes a resistance component, a resistance of the second path being greater than a resistance of a first path, the first path being from a first terminal of the first switching element to the first variable resistance element.

Implementations of the above electronic device may include one or more the following.

The first switching element includes a first transistor having a first junction region corresponding to the first terminal of the first switching element, wherein the second switching element includes a second transistor having a first junction region corresponding to the first terminal of the second switching element, and wherein a concentration of impurities of the first junction region of the second switching element is lower than a concentration of impurities of the first junction region of the first switching element. The second transistor further includes a second junction region corresponding to a second terminal of the second switching element, and wherein the concentration of the impurities of the first junction region of the second transistor is lower than a concentration of impurities of the second junction region of the second transistor. The first switching element includes a first transistor having a first junction region corresponding to the first terminal of the first switching element, wherein the second switching element includes a second transistor having a first junction region corresponding to the first terminal of the second switching element, and wherein an additional impurity doping region is disposed within the first junction region of the first switching element without being disposed within the first junction region of the second switching element. The second transistor further includes a second junction region corresponding to a second terminal of the second switching element, and wherein an additional impurity doping region is disposed within the second junction region of the second transistor. The first switching element includes a first transistor having a first junction region corresponding to the first terminal of the first switching element, wherein the second switching element includes a second transistor having a first junction region corresponding to the first terminal of the second switching element, and wherein a first additional impurity doping region having a first impurity concentration is disposed within the first junction region of the first transistor, and a second additional impurity doping region having a second impurity concentration is disposed within the first junction region of the second transistor, the second impurity concentration being lower than the first impurity concentration. The second transistor further includes a second junction region corresponding to a second terminal of the second switching element, and wherein a third additional impurity doping region is disposed within the second junction region of the second transistor, the third additional impurity doping region having the first impurity concentration. The first switching element includes a first transistor having a first junction region corresponding to the first terminal of the first switching element, wherein the second switching element includes a second transistor having a first junction region corresponding to the first terminal of the second switching element, and wherein the number of first contact plugs disposed over and coupled to the first junction region of the first transistor is greater than the number of second contact plugs disposed over and coupled to the first junction region of the second transistor. The second transistor further includes a second junction region corresponding to a second terminal of the second switching element, and wherein the number of contact plugs disposed over and coupled to the second junction region of the second transistor is greater than the number of the second contact plugs disposed over and coupled to the first junction region of the second transistor. The first switching element includes a first transistor having a first junction region corresponding to the first terminal of the first switching element, wherein the second switching element includes a second transistor having a first junction region corresponding to the first terminal of the second switching element, and wherein a volume of a first contact plug disposed over and coupled to the first junction region of the first transistor is larger than a volume of a second contact plug disposed over and coupled to the first junction region of the second transistor. The second transistor further includes a second junction region corresponding to a second terminal of the second switching element, and wherein a volume of a contact plug disposed over and coupled to the second junction region of the second transistor is larger than a volume of the second contact plug disposed over and coupled to the first junction region of the second transistor. The first switching element includes a first transistor having a first junction region corresponding to the first terminal of the first switching element, wherein the second switching element includes a second transistor having a first junction region corresponding to the first terminal of the second switching element, and wherein a resistivity of a first material included in a first contact structure disposed over and coupled to the first junction region of the first transistor is smaller than a resistivity of a second material included in a second contact structure disposed over and coupled to the first junction region of the second transistor. The second transistor further includes a second junction region corresponding to a second terminal of the second switching element, and wherein a resistivity of a material included in a contact structure disposed over and coupled to the second junction region of the second transistor is smaller than a resistivity of the second material included in the second contact structure disposed over and coupled to the first junction region of the second transistor. The first contact structure includes a stack structure of a plurality of first conductive patterns, wherein the second contact structure includes a stack structure of a plurality of second conductive patterns, the second conductive patterns being located to correspond to the first conductive patterns, respectively, in a stacking direction, and wherein a resistivity of a first pattern of the first conductive patterns is smaller than a resistivity of a second pattern of the second conductive patterns where the second pattern is located at the same level as the first pattern in the stacking direction. The first material includes W, and the second material includes TiN or TiAlN. The first variable resistance element is located between a first word line and a first bit line at an intersection region between the first word line and the first bit line, wherein the second variable resistance element is located between a second word line and a second bit line at an intersection region between the second word line and the second bit line, wherein the first switching element includes a first word line switching element coupled to the first variable resistance element via the first word line and a first bit line switching element coupled to the first variable resistance element via the first bit line, and wherein the second switching element includes a second word line switching element coupled to the second variable resistance element via the second word line and a second bit line switching element coupled to the second variable resistance element via the second bit line. The resistance component is located between the second word line switching element and the second variable resistance element, between the second bit line switching element and the second variable resistance element, or both. The semiconductor memory comprises a plurality of cell mats where each of the cell mats includes the first variable resistance element and the second variable resistance element, the first and second word line switching elements are located between two cell mats which are adjacent to each other in an extending direction of the first and second word lines, and the first and second bit line switching elements are located between two cell mats which are adjacent to each other in an extending direction of the first and second bit lines.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

These and other aspects, implementations, and associated advantages are described in greater detail in the drawings, the description and the claims.

BRIEF DESCRIPTION OF THE DRAWINGS

FIG. 7 is a cross-sectional view illustrating a switching element and components coupled to the switching element, in accordance with still another implementation of the present disclosure.

DETAILED DESCRIPTION

Figure 1:
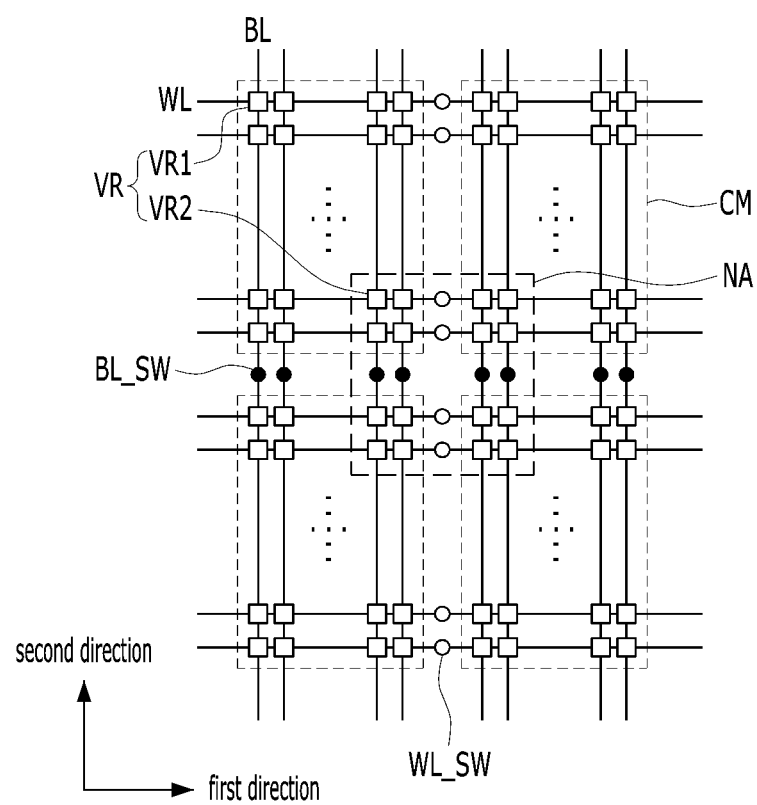
FIG. 1 is a view illustrating a semiconductor memory in accordance with an implementation of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a view illustrating a semiconductor memory in accordance with an implementation of the present disclosure.

Referring to FIG. 1, the semiconductor memory according to the present implementation may include one or more cell mats CMs. FIG. 1 shows 2*2 cell mats CMs that are arranged in a first direction and a second direction crossing the first direction. However, in other implementations, the number and/or the arrangement of cell mats CMs may be variously modified.

Each cell mat CM may include a plurality of memory cells for storing data. In the present implementation, each memory cell may include a variable resistance element VR. The variable resistance element VR may switch between different resistance states according to a voltage or current applied to its two ends, thereby storing different data according to the different resistance states. The variable resistance element VR may have a single-layered structure or a multi-layered structure, including one or more of various materials used in an RRAM, a PRAM, an FRAM, an MRAM, and the like. For example, the variable resistance element VR may include any of a metal oxide such as a transition metal oxide or a perovskite-based material, a phase-change material such as a chalcogenide-based material, a ferroelectric material, a ferromagnetic material, and the like.

A plurality of variable resistance elements VRs may be located between a plurality of word lies WL extending in the first direction and a plurality of bit lines BL extending in the second direction at intersection regions between the word lines WL and the bit lines BL. For example, when the word line WL is located over the bit line BL in a third direction perpendicular to the first and second directions, an upper end and a lower end of the variable resistance element VR may be coupled to the word line WL and the bit line BL, respectively. Alternatively, when the bit line BL is located over the word line WL in the third direction, the upper end and the lower end of the variable resistance element VR may be coupled to the bit line BL and the word line WL, respectively. The variable resistance element VR may receive a voltage or current through the word line WL and the bit line BL.

A word line switching element WL_SW may be coupled to and located between two cell mats CMs, which are adjacent to each other in the first direction. The word line switching element WL_SW may be coupled to a word line WL included in each of the two adjacent cell mats CMs, and may control access to the word line WL.

A bit line switching element BL_SW may be coupled to and located between two cell mats CMs, which are adjacent to each other in the second direction. The bit line switching element BL_SW may be coupled to a bit line BL included in each of the two adjacent cell mats CMs, and may control access to the bit line BL.

Each of the word line switching element WL_SW and the bit line switching element BL_SW may include a transistor. However, implementations are not limited thereto, and any of various elements, which are capable of being turned on/off, may be used as each of the word line switching element WL_SW and the bit line switching element BL_SW.

During an operation of the variable resistance element VR, for example, a write operation to change the resistance state of the variable resistance element VR or a read operation to read the resistance state of the variable resistance element VR, a first current flow or a second current flow may be generated. The first current flow passes through a writing path of the bit line switching element BL_SW, the bit line BL, the variable resistance element VR, the word line WL, and the word line switching element WL_SW. The second current flow passes through a reading path of the word line switching element WL_SW, the word line WL, the variable resistance element VR, the bit line BL, and the bit line switching element BL_SW.

Here, a resistance of the writing and reading paths may vary according to a position of the variable resistance element VR within the cell mat CM. As the variable resistance element VR is located closer to the bit line switching element BL_SW and/or the word line switching element WL_SW, the writing and reading paths may be shorter, and thus, the resistance of the writing and reading paths may decrease. On the other hand, as the variable resistance element VR is located farther from the bit line switching element BL_SW and/or the word line switching element WL_SW, the writing and reading paths may be longer, and thus, the resistance of the writing and reading paths may increase.

For example, when a region, which is adjacent to both the word line switching element WL_SW and the bit line switching element BL_SW and is referred to as a 'near region NA,' a resistance of a path passing through a variable resistance element VR, which is located in the near region NA, may be smaller than a resistance of a path passing through a variable resistance element VR, which is located in a region other than the near region NA. Hereinafter, for convenience of explanation, the variable resistance element VR located in the near region NA may be referred to as a 'second variable resistance element VR2' and the variable resistive element VR located in the other region may be referred to as a 'first variable resistance element VR1.'

Also, for convenience of explanation, a path passing through the bit line switching element BL_SW, the bit line BL, the first variable resistance element VR1, the word line WL, and the word line switching element WL_SW or a reverse path thereof may be referred to as a 'first path.' A path passing through the bit line switching element BL_SW, the bit line BL, the second variable resistance element VR2, the word line WL, and the word line switching element WL_SW or a reverse path thereof may be referred to as a 'second path.' Since a length of the second path is shorter than a length of the first path, a resistance of the second path may be smaller than a resistance of the first path. In the present implementation, the number of second variable resistance elements VR2 included in the near region NA is 4*4, but the number and the arrangement of the second variable resistance elements VR2 may be variously modified.

As described above, when a difference in resistances of the paths passing through variable resistance elements VRs occurs, write characteristics and/or read characteristics may be varied according to positions of the variable resistance elements VRs, and thus, operating characteristics of the semiconductor memory may be deteriorated. For example, during a write operation that is performed on the second variable resistance element VR2 located in the near region NA, the resistance of the second path may be relatively small compared to the resistance of the first path, and thus a relatively excessive current may be supplied to the second variable resistance element VR2 compared to the first variable resistance element VR1. As a result, a failure of the second variable resistance element VR2 may be induced.

Therefore, in the present implementation, a resistance component may be added to paths passing through a variable resistance element VR, which is relatively close to the word line switching element WL_SW and/or the bit line switching element BL_SW, to thereby increase a resistance of the paths. This will be described by a way of example with reference to FIGS. 2A and 2B.

Figure 2A:
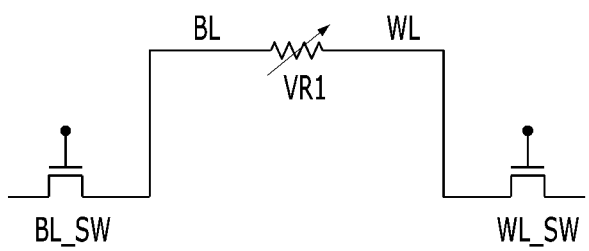
FIG. 2A is a circuit diagram showing a first variable resistance element of FIG. 1 and components coupled to the first variable resistance element, in accordance with an implementation of the present disclosure.
Figure 2B:
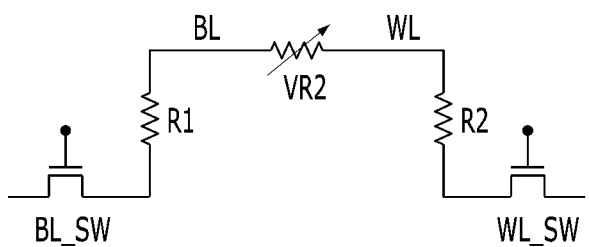
FIG. 2B is a circuit diagram showing a second variable resistance element of FIG. 1 and components coupled to the second variable resistance element, in accordance with an implementation of the present disclosure.

FIG. 2A is a circuit diagram showing the first variable resistance element VR1 of FIG. 1 and components coupled to the first variable resistance element VR1, and FIG. 2B is a circuit diagram showing the second variable resistance element VR2 of FIG. 1 and components coupled to the second variable resistance element VR2.

Referring to FIG. 2A, a first terminal of the first variable resistance element VR1 may be coupled to a bit line BL and a bit line switching element BL_SW, and a second terminal of the first variable resistance element VR1 may be coupled to a word line WL and a word line switching element WL_SW. Accordingly, during an operation of the first variable resistance element VR1, a current flow, which passes through a first path of the bit line switching element BL_SW, the bit line BL, the first variable resistance element VR1, the word line WL, and the word line switching element WL_SW, or a reverse current flow thereof may occur.

Referring to FIG. 2B, a first terminal of the second variable resistance element VR2 may be coupled to a bit line BL and a bit line switching element BL_SW, and a second terminal of the second variable resistance element VR2 may be coupled to a word line WL and a word line switching element WL_SW. Accordingly, during an operation of the second variable resistance element VR2, a current flow, which passes through a second path of the bit line switching element BL_SW, the bit line BL, the second variable resistance element VR2, the word line WL, and the word line switching element WL_SW, or a reverse current flow thereof may occur.

Here, an additional resistance component may be present in the second path compared to the first path. For example, a first resistance component R1 may be present between the bit line BL and the bit line switching element BL_SW on the second path, and a second resistance component R2 may be present between the word line WL and the word line switching element WL_SW on the second path. Therefore, a resistance of the second path may be increased compared to the first path, because the first resistance component R1 and the second resistance component R2 are not included in the first path.

As described above, the second variable resistance element VR2 may be located closer to the bit line switching element BL_SW and the word line switching element WL_SW than the first variable resistance element VR1. Accordingly, when the first and second resistance components R1 and R2 are omitted from the second path, a resistance of the first path may be larger than a resistance of the second path. However, in the present implementation, since the first and second resistance components R1 and R2 are present in the second path, the resistance of the second path may be increased and may be the same as or similar to the resistance of the first path.

In the present implementation, both the first resistance component R1 and the second resistance component R2 are present in the second path. However, if necessary, one of the first and second resistance components R1 and R2 may be omitted. Also, a size, the number, and/or a position of each of the first and second resistance components R1 and R2 may be variously modified.

Hereinafter, a specific method for forming the first resistance component R1 and/or the second resistance component R2 will be described by a way of example with reference to FIGS. 3 to 7.

Figure 3:
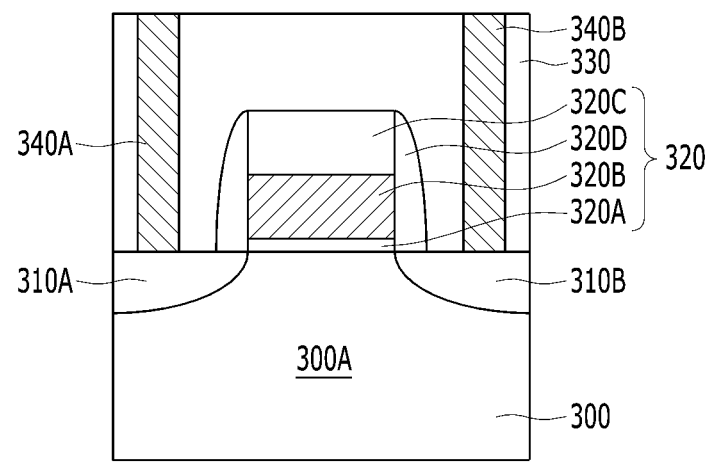
FIG. 3 is a cross-sectional view illustrating a switching element and components coupled to the switching element, in accordance with an implementation of the present disclosure.

FIG. 3 is a cross-sectional view illustrating a switching element and components coupled to the switching element, in accordance with an implementation of the present disclosure. The switching element of the present implementation may correspond to one or both of the bit line switching element BL_SW and the word line switching element WL_SW of FIG. 2B.

Referring to FIG. 3, the switching element of the present implementation may include a transistor. The transistor of the present implementation may include a semiconductor substrate 300 including an active region 300A defined by an isolation layer (not shown), a gate structure 320 located over the semiconductor substrate 300 and crossing the active region 300A, and first and second junction regions 310A and 310B formed in the active region 300A at both sides of the gate structure 320, respectively.

The semiconductor substrate 300 may include any of various semiconductor materials, such as silicon.

The gate structure 320 may include a stack structure of a gate insulating layer 320A, a gate electrode 320B, and a gate hard mask 320C, and a gate spacer 320D formed over a sidewall of the stack structure. The gate electrode 320B may apply a voltage to a channel of the transistor. The channel may be formed in the active region 300A between the first and second junction regions 310A and 310B. The gate insulating layer 320A may be disposed between the gate electrode 320B and the active region 300A, and may electrically separate the gate electrode 320B from the active region 300A. The gate hard mask 320C may be used in a patterning process of forming the gate electrode 320B and the gate insulating layer 320A, and may protect an upper surface of the gate electrode 320B. The gate spacer 320D may be formed over the sidewall of the stack structure of the gate insulating layer 320A, the gate electrode 320B, and the gate hard mask 320C to protect a sidewall of the gate electrode 320B.

The gate electrode 320B may include a conductive material such as polysilicon doped with impurities, a metal, a metal compound, a combination thereof, or the like. The gate insulating layer 320A, the gate hard mask 320C, and the gate spacer 320D may include an insulating material such as a silicon oxide, a silicon nitride, a carbon-based material, a combination thereof, or the like. In the present implementation, the gate structure 320 may be formed over the semiconductor substrate 300. However, in another implementation, at least a portion of the gate structure 320 may be buried in the semiconductor substrate 300.

The first and second junction regions 310A and 310B may be formed by doping impurities into the active region 300A. One of the first and second junction regions 310A and 310B may function as a source region of the transistor, and the other of the first and second junction regions 310A and 310B may function as a drain region of the transistor.

First and second contact plugs 340A and 340B may be formed over and coupled to the first and second junction regions 310A and 310B, respectively. The first and second contact plugs 340A and 340B may penetrate through an interlayer insulating layer 330, which covers the transistor of the present implementation. The first and second contact plugs 340A and 340B may include a conductive material having a low resistance, for example, a metal, a metal nitride, a metal silicide, or a combination thereof. The interlayer insulating layer 330 may include an insulating material such as a silicon oxide, a silicon nitride, a carbon-based material, or a combination thereof.

For convenience of explanation, the first junction region 310A and the second junction region 310B may be referred to as a source region and a drain region, respectively. For reference, a drain region of the bit line switching element BL_SW or the word line switching element WL_SW of FIG. 2B may be coupled to the second variable resistance element VR2 through the bit line BL or the word line WL, respectively. A source region of the bit line switching element BL_SW or the word line switching element WL_SW of FIG. 2B may be located at a position opposite to the drain region with respect to a channel (or a gate structure) thereof and coupled to another element, for example, a bit line BL or a word line WL of an adjacent cell mat CM, respectively.

Here, if an impurity concentration of the second junction region 310B functioning as the drain region decreases, a contact resistance between the second contact plug 340B and the second junction region 310B may increase. In other words, by reducing the impurity concentration of the second junction region 310B, the first resistance component R1 and/or the second resistance component R2 of FIG. 2B may be formed by the impurity concentration difference. On the other hand, an impurity concentration of the first junction region 310A functioning as the source region, which is irrelevant to the formation of the first resistance component R1 and/or the second resistance component R2, may be kept relatively high. This is for securing current characteristics of the transistor. Therefore, the impurity concentration of the first junction region 310A may be higher than the impurity concentration of the second junction region 310B.

The first and second junction regions 310A and 310B may be formed by doping impurities into the active region 300A at the both sides of the gate structure 320 using the gate structure 320 as a mask to form initial first and second junction regions (not shown) having the same impurity concentration, and then by additionally doping impurities into the initial first junction region when the initial second junction region is covered with a mask pattern. Accordingly, the impurity concentration of the first junction region 310A becomes higher than the impurity concentration of the second junction region 310B. The doping of impurities may be performed by an ion implantation process.

Alternatively, the first and second junction regions 310A and 310B may be formed by doping impurities having a relatively high concentration into a first portion of the active region 300A, which corresponds to the first junction region 310A, and then by doping impurities having a relatively low concentration into a second portion of the active region 300A, which corresponds to the second junction region 310B. The doping of the impurities having the relatively high concentration is performed when the first portion of the active region 300A is exposed and the second portion of the active region 300A is covered. The doping of impurities having the relatively low concentration is performed in a state that the first portion of the active region 300A is covered and the second portion of the active region 300A is exposed. A type of impurities of the first junction region 310A may be the same as a type of impurities of the second junction region 310B.

Meanwhile, although not shown, first and second junction regions of any of the bit line switching element BL_SW and the word line switching element WL_SW of FIG. 2A may have a relatively high impurity concentration. This is because the circuit of FIG. 2A does not have the first and second resistance components R1 and R2. Specifically, the impurity concentrations of the first and second junction regions of any of the bit line switching element BL_SW and the word line switching element WL_SW of FIG. 2A may be higher than the impurity concentration of the second junction region 310B of the present implementation, and may be the same as or similar to the impurity concentration of the first junction region 310A of the present implementation. Also, the impurity concentrations of the first and second junction regions of any of the bit line switching element BL_SW and the word line switching element WL_SW of FIG. 2A may be substantially the same.

Figure 4:
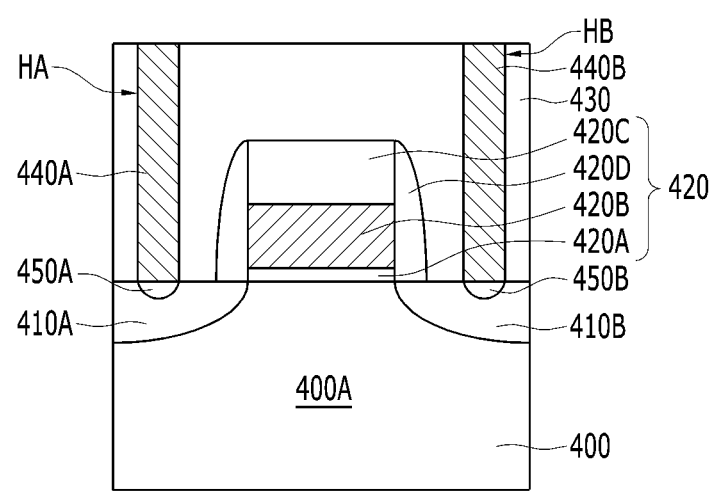
FIG. 4 is a cross-sectional view illustrating a switching element and components coupled to the switching element, in accordance with another implementation of the present disclosure.

FIG. 4 is a cross-sectional view illustrating a switching element and components coupled to the switching element in accordance with another implementation of the present disclosure. The switching element of the present implementation may correspond to one or both of the bit line switching element BL_SW and the word line switching element WL_SW of FIG. 2B.

Referring to FIG. 4, the switching element of the present implementation, for example, a transistor, may include a semiconductor substrate 400 including an active region 400A defined by an isolation layer (not shown), a gate structure 420 located over the semiconductor substrate 400 and crossing the active region 400A, and first and second junction regions 410A and 410B formed in the active region 400A at both sides of the gate structure 420, respectively.

The gate structure 420 may include a stack structure of a gate insulating layer 420A, a gate electrode 420B, and a gate hard mask 420C, and a gate spacer 420D formed over a sidewall of the stack structure.

For convenience of explanation, the first junction region 410A and the second junction region 410B may be referred to as a source region and a drain region, respectively. Accordingly, the second junction region 410B may be coupled to the second variable resistance element VR2 of FIG. 2B. In an implementation, the first junction region 410A and the second junction region 410B may have substantially the same impurity concentration. However, in another implementation, similar to the aforementioned implementation of FIG. 3, the impurity concentration of the second junction region 410B may be lower than the impurity concentration of the first junction region 410A.

First and second contact plugs 440A and 440B may be formed over and coupled to the first and second junction regions 410A and 410B, respectively. The first and second contact plugs 440A and 440B may penetrate through an interlayer insulating layer 430, which covers the transistor of the present implementation. Specifically, the first and second contact plugs 440A and 440B may be formed by selectively etching the interlayer insulating layer 430 to form a first hole HA exposing a portion of the first junction region 410A and a second hole HB exposing a portion of the second junction region 410B, and filling the first hole HA and the second hole HB with a conductive material.

Here, before filling the first hole HA and the second hole HB with the conductive material, impurities may be further doped into the first junction region 410A and/or the second junction region 410B exposed by the first hole HA and/or the second hole HB, respectively, so that a first additional doping region 450A and/or a second additional doping region 450B may be formed within the first junction region 410A and/or the second junction region 410B, respectively.

For example, impurities may be further doped into the first junction region 410A exposed by the first hole HA while not being doped into the second junction region 410B exposed by the second hole HB. This process may be performed by performing an impurity doping process, for example, an ion implantation process when a mask pattern (not shown), which exposes the first hole HA and covers the second hole HB, is formed. As a result of the impurity doping process, the first additional doping region 450A may be formed within the first junction region 410A, but the second additional doping region 450B may not be formed within the second junction region 410B. Therefore, a contact resistance between the first junction region 410A and the first contact plug 440A decreases by the first additional doping region 450A, and thus a contact resistance between the second junction region 410B and the second contact plug 440B may be larger than the contact resistance between the first junction region 410A and the first contact plug 440A. As a result, the first resistance component R1 and/or the second resistance component R2 of FIG. 2B may be formed as the first additional doping region 450A is formed within the first junction region 410A while the second additional doping region 450 B is not formed within the second junction region 410B.

Alternatively, impurities may be further doped into the first junction region 410A exposed by the first hole HA and the second junction region 410B exposed by the second hole HB. Here, a concentration of impurities doped into the first junction region 410A may be higher than a concentration of impurities doped into the second junction region 410B. In other words, the first additional doping region 450A and the second additional doping region 450B may be formed within the first and second junction regions 410A and 410B, respectively, and an impurity concentration of the first additional doping region 450A may be higher than an impurity concentration of the second additional doping region 450B. This process may include doping impurities having a relatively high concentration when a mask pattern (not shown), which exposes the first hole HA and covers the second hole HB, is formed, and doping impurities having a relatively low concentration when a mask pattern (not shown), which covers the first hole HA and exposes the second hole HB, is formed. Since a decreasing amount in the contact resistance between the first junction region 410A and the first contact plug 440A by the first additional doping region 450A is larger than a decreasing amount in the contact resistance between the second junction region 410B and the second contact plug 440B by the second additional doping region 450B, the contact resistance between the second junction region 410B and the second contact plug 440B may be relatively increased. The first resistance component R1 and/or the second resistance component R2 of FIG. 2B may be formed by the impurity concentration difference between the first and second additional doping regions 450A and 450B that are formed within the first and second junction regions 410A and 410B, respectively.

Meanwhile, although not shown, first and second junction regions of any of the bit line switching element BL_SW and the word line switching element WL_SW of FIG. 2A may have first and second additional doping regions therein. Here, impurity concentrations of the first and second additional doping regions added to any of the bit line switching element BL_SW and the word line switching element WL_SW of FIG. 2A may be higher than the impurity concentration of the second additional doping region 450B of the present implementation, and may be the same as or similar to the impurity concentration of the first additional doping region 450A of the present implementation. Also, the impurity concentrations of the first and second additional doping regions added to any of the bit line switching element BL_SW and the word line switching element WL_SW of FIG. 2A may be substantially the same.

Figure 5A:
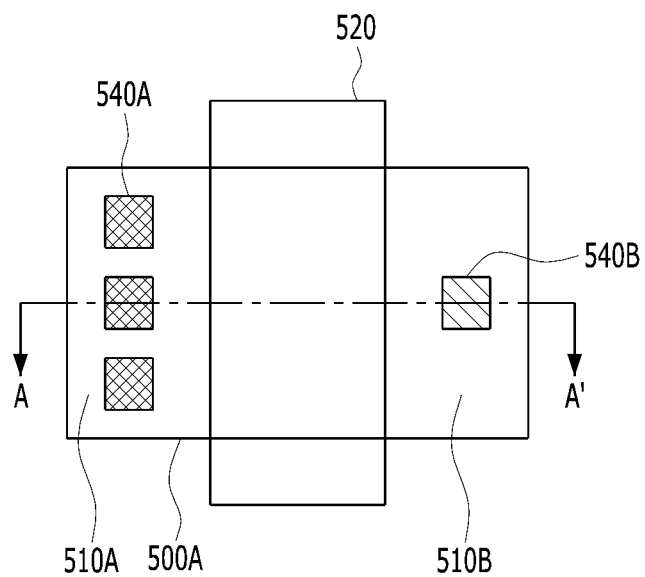
FIGS. 5A and 5B are views illustrating a switching element and components coupled to the switching element, in accordance with still another implementation of the present disclosure.
Figure 5B:
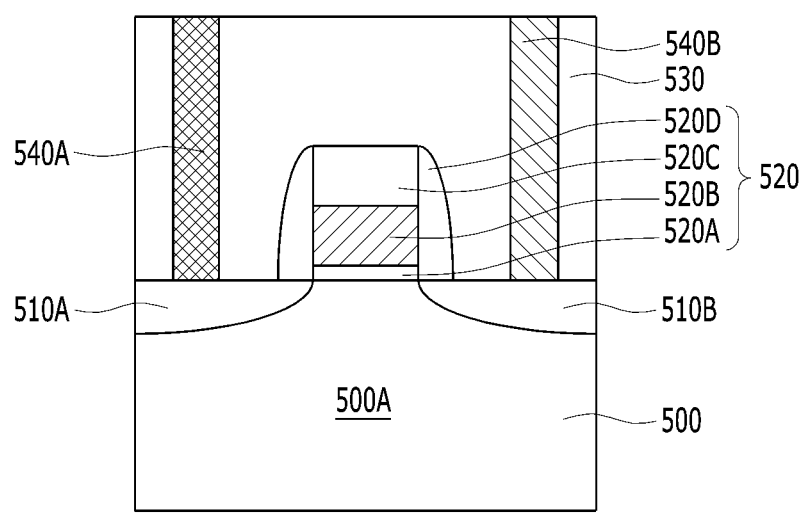

FIGS. 5A and 5B are views illustrating a switching element and components coupled to the switching element, in accordance with still another implementation of the present disclosure. FIG. 5A shows a plan view, and FIG. 5B shows a cross-sectional view taken along a line A-A' of FIG. 5A. The switching element of the present implementation may correspond to one or both of the bit line switching element BL_SW and the word line switching element WL_SW of FIG. 2B.

Referring to FIGS. 5A and 5B, the switching element of the present implementation, for example, a transistor, may include a semiconductor substrate 500 including an active region 500A defined by an isolation layer (not shown), a gate structure 520 located over the semiconductor substrate 500 and crossing the active region 500A, and first and second junction regions 510A and 510B formed in the active region 500A at both sides of the gate structure 520.

The gate structure 520 may include a stack structure of a gate insulating layer 520A, a gate electrode 520B, and a gate hard mask 520C, and a gate spacer 520D formed over a sidewall of the stack structure.

For convenience of explanation, the first junction region 510A and the second junction region 510B may be referred to as a source region and a drain region, respectively. Accordingly, the second junction region 510B may be coupled to the second variable resistance element VR2 of FIG. 2B. In an implementation, the first junction region 510A and the second junction region 510B may have substantially the same impurity concentration. However, in another implementation, similar to the aforementioned implementation of FIG. 3, the impurity concentration of the second junction region 510B may be lower than the impurity concentration of the first junction region 510A. Furthermore, in still other implementations, similar to the aforementioned implementation of FIG. 4, an additional doping region may be formed within the first junction region 510A without being disposed within the second junction region 510B, or an additional doping region containing a relatively high concentration of impurities may be formed within the first junction region 510A and an additional doping region containing a relatively low concentration of impurities may be formed within in the second junction region 510B.

First and second contact plugs 540A and 540B may be formed over and coupled to the first and second junction regions 510A and 510B, respectively. The first and second contact plugs 540A and 540B may be formed to penetrate through an interlayer insulating layer 530, which covers the transistor of the present implementation.

Here, as shown in FIG. 5A, the number of first contact plugs 540A may be greater than the number of second contact plugs 540B. In the present implementation, three first contact plugs 540A and one second contact plug 540B are formed over and coupled to the first and second junction regions 510A and 510B, respectively. However, the numbers of first and second contact plugs 540A and 540B may be variously modified. When the number of first contact plugs 540A is larger than the number of second contact plugs 540B, a current may easily flow through the first contact plugs 540A compared to the second contact plugs 540B, and thus, a resistance of the first contact plugs 540A may be reduced. That is, a resistance of the second contact plugs 540B may be greater than the resistance of the first contact plugs 540A since the number of second contact plugs 540B is smaller than the number of the first contact plug 540A.

The first resistance component R1 and/or the second resistance component R2 of FIG. 2B may be formed by a difference between the number of first contact plugs 540A and the number of second contact plugs 540B.

The first contact plugs 540A may be arranged in a direction in which the gate structure 520 crosses the active region 500A, that is, a direction crossing the line A-A'. This is for securing a space between the first contact plugs 540A and the gate structure 520. However, in other implementations, the first contact plugs 540A may be arranged in different directions than the direction crossing the line A-A'.

Meanwhile, although not shown, the numbers of first and second contact plugs, which are coupled to first and second junction regions of any of the bit line switching element BL_SW and the word line switching element WL_SW of FIG. 2A, may be greater than the number of second contact plugs 540B of the present implementation, and may be the same as the number of first contact plugs 540A of the present implementation.

Figure 6A:
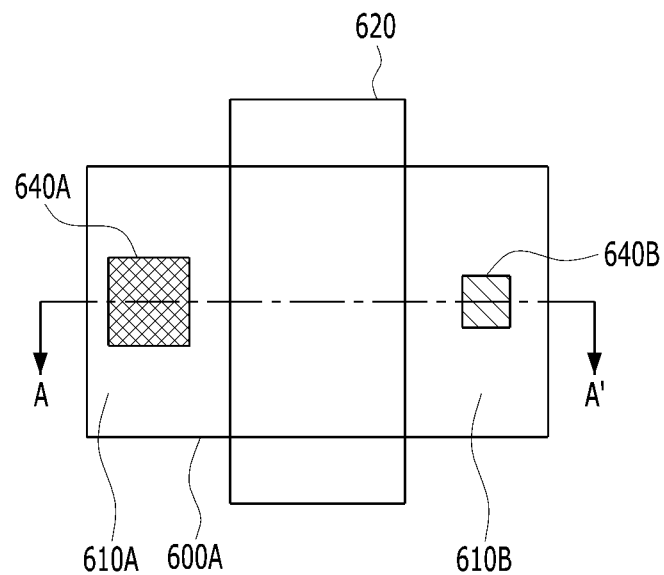
FIGS. 6A and 6B are views illustrating a switching element and components coupled to the switching element, in accordance with still another implementation of the present disclosure.
Figure 6B:
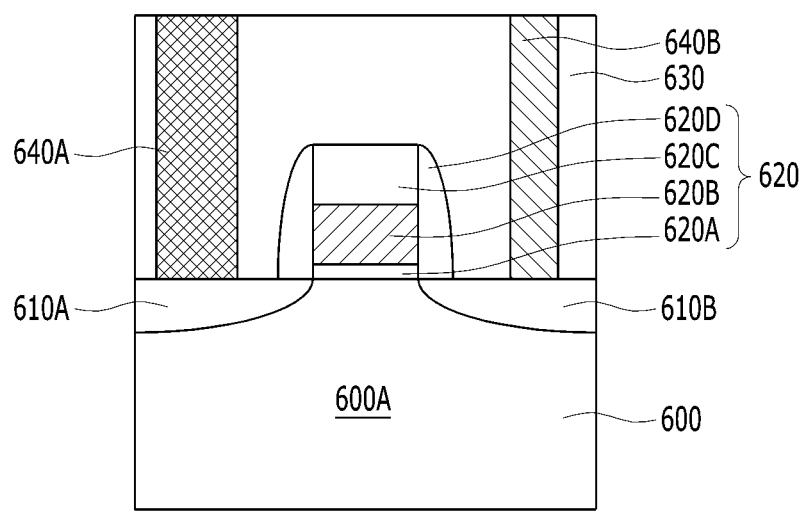

FIGS. 6A and 6B are views illustrating a switching element and components coupled to the switching element, in accordance with still another implementation of the present disclosure. FIG. 6A shows a plan view, and FIG. 6B shows a cross-sectional view taken along a line A-A' of FIG. 6A. The switching element of the present implementation may correspond to one or both of the bit line switching element BL_SW and the word line switching element WL_SW of FIG. 2B.

Referring to FIGS. 6A and 6B, the switching element of the present implementation, for example, a transistor, may include a semiconductor substrate 600 including an active region 600A defined by an isolation layer (not shown), a gate structure 620 located over the semiconductor substrate 600 and crossing the active region 600A, and first and second junction regions 610A and 610B formed in the active region 600A at both sides of the gate structure 620.

The gate structure 620 may include a stack structure of a gate insulating layer 620A, a gate electrode 620B, and a gate hard mask 620C, and a gate spacer 620D formed over a sidewall of the stack structure.

For convenience of explanation, the first junction region 610A and the second junction region 610B may be referred to as a source region and a drain region, respectively. Accordingly, the second junction region 610B may be coupled to the second variable resistance element VR2 of FIG. 2B. The first junction region 610A and the second junction region 610B may have substantially the same impurity concentration. However, in another implementation, similar to the aforementioned implementation of FIG. 3, the impurity concentration of the second junction region 610B may be lower than the impurity concentration of the first junction region 610A. Furthermore, in still other implementations, similar to the aforementioned implementation of FIG. 4, an additional doping region may be formed within the first junction region 610A while not formed within the second junction region 610B, or an additional doping region containing a relatively high concentration of impurities may be formed within the first junction region 610A and an additional doping region containing a relatively low concentration of impurities may be formed within the second junction region 610B.

First and second contact plugs 640A and 640B may be formed over and coupled to the first and second junction regions 610A and 610B, respectively. The first and second contact plugs 640A and 640B may be formed to penetrate through an interlayer insulating layer 630, which covers the transistor of the present implementation.

Here, a planar area and/or a volume of the first contact plug 640A may be larger than a planar area and/or a volume of the second contact plug 640B. When the volume of the first contact plug 640A is larger than the volume of the second contact plug 640B, a current may easily flow through the first contact plug 640A compared to the second contact plug 640B, and thus, a resistance of the first contact plug 640A may be reduced. That is, a resistance of the second contact plug 640B may be greater than the resistance of the first contact plug 640A since the volume of the second contact plug 640B is smaller than the volume of the first contact plug 640A. The first resistance component R1 and/or the second resistance component R2 of FIG. 2B may be formed by a difference in the volumes of the first and second contact plugs 640A and 640B.

In the present implementation, a length of the first contact plug 640A in a first direction in which the gate structure 620 crosses the active region 600A, for example, in a longitudinal direction, may be longer than a length of the second contact plug 640B in the first direction, and/or a length of the first contact plug 640A in a second direction crossing the first direction, may be longer than a length of the second contact plug 640B in the second direction. Accordingly, the planar area of the first contact plug 640A may be larger than the planar area of the second contact plug 640B. However, to secure a space between the first contact plug 640A and the gate structure 620, while the length of the first contact plug 640A in the first direction may be longer than the length of the second contact plug 640B in the first direction, the length of the first contact plug 640A in the second direction may be substantially the same as the length of the second contact plug 640B in the second direction.

Also, in the present implementation, the number of first contact plugs 640A and the number of second contact plugs 640B may be the same. However, in another implementation, similar to the aforementioned implementation of FIGS. 5A and 5B, the number of first contact plugs 640A may be greater than the number of second contact plugs 640B.

Meanwhile, although not shown, a planar area and/or a volume of first and second contact plugs, which are coupled to first and second junction regions of any of the bit line switching element BL_SW and the word line switching element WL_SW of FIG. 2A, respectively, may be larger than the planar area and/or the volume of the second contact plug 640B of the present implementation, and may be substantially the same as the planar area and/or the volume of the first contact plug 640A of the present implementation.

FIG. 7 is a cross-sectional view illustrating a switching element and components coupled to the switching element, in accordance with still another implementation of the present disclosure. The switching element of the present implementation may correspond to one or both of the bit line switching element BL_SW and the word line switching element WL_SW of FIG. 2B.

Referring to FIG. 7, the switching element of the present implementation, for example, a transistor, may include a semiconductor substrate 700 including an active region 700A defined by an isolation layer (not shown), a gate structure 720 located over the semiconductor substrate 700 and crossing the active region 700A, and first and second junction regions 710A and 710B formed in the active region 700A at both sides of the gate structure 720.

The gate structure 720 may include a stack structure of a gate insulating layer 720A, a gate electrode 720B, and a gate hard mask 720C, and a gate spacer 720D formed over a sidewall of the stack structure.

For convenience of explanation, the first junction region 710A and the second junction region 710B may be referred to as a source region and a drain region, respectively. Accordingly, the second junction region 710B may be a terminal coupled to the second variable resistance element VR2 of FIG. 2B. The first junction region 710A and the second junction region 710B may have substantially the same impurity concentration. However, in another implementation, similar to the aforementioned implementation of FIG. 3, the impurity concentration of the second junction region 710B may be lower than the impurity concentration of the first junction region 710A. Furthermore, in still other implementations, similar to the aforementioned implementation of FIG. 4, an additional doping region may be formed within the first junction region 710A while not being formed within the second junction region 710B, or an additional doping region containing a relatively high concentration of impurities may be formed within the first junction region 710A and an additional doping region containing a relatively low concentration of impurities may be formed within the second junction region 710B.

First and second contact structures CA and CB may be formed over and coupled to the first and second junction regions 710A and 710B, respectively. A first line 790A may be formed over and coupled to the first contact structure CA, and a second line 790B may be formed over and coupled to the second contact structure CB. Here, the second line 790B may correspond to the bit line BL that is coupled to one end of the bit line switching element BL_SW of FIG. 2B or the word line WL that is coupled to one end of the word line switching element WL_SW of FIG. 2B. The first line 790A may correspond to a line (not shown) that is coupled to the other end of the bit line switching element BL_SW or a line (not shown) coupled to the word line switching element WL_SW of FIG. 2B, for example, a source line.

Each of the first and second contact structures CA and CB may include a stack structure of one or more conductive patterns. For example, the first contact structure CA may include three first contact plugs 740A, 760A, and 780A, which are stacked in a vertical direction, and two first contact pads 750A and 770A, which are alternately stacked with the first contact plugs 740A, 760A, and 780A. The second contact structure CB may include three second contact plugs 740B, 760B, and 780B, which are stacked in the vertical direction, and two second contact pads 750B and 770B, which are alternately stacked with the second contact plugs 740B, 760B, and 780B. However, the number and/or a shape of conductive patterns constituting the first and second contact structures CA and CB may be variously modified.

Here, the second contact structure CB may include a material having a higher resistivity than a material of the first contact structure CA. For example, when the first contact structure CA includes W, at least a portion of the second contact structure CB may include TiN and/or TiAlN, which have higher resistivities than W. Also, when each of the first and second contact structures CA and CB includes a stack structure of a plurality of conductive patterns, at least one conductive pattern of the second contact structure CB may include a material having a higher resistivity than a conductive pattern of the first contact structure CA, which corresponds to the at least one conductive pattern of the second contact structure CB.

For example, the uppermost second contact plug 780B of the second contact structure CB may include a material, which has a higher resistivity than a material of the uppermost first contact plug 780A of the first contact structure CA.

Here, the remaining portions 740B, 750B, 760B, and 770B of the second contact structure CB may have the same resistivity as the remaining portions 740A, 750A, 760A, and 770A of the first contact structure CA, respectively. Alternatively, at least one of the remaining portions 740B, 750B, 760B, and 770B of the second contact structure CB may have a higher resistivity than a corresponding one of the remaining portions 740A, 750A, 760A, and 770A of the first contact structure CA. As a result, since a resistance of the second contact structure CB increases, the first resistance component R1 and/or the second resistance component R2 of FIG. 2B may be formed.

In the present implementation, the number and a volume of the first contact structures CA may be the same as the number and a volume of the second contact structures CB. However, in an implementation, similar to the aforementioned implementation of FIGS. 5A and 5B, the number of the first contact structures CA may be greater than the number of the second contact structures CB. Alternatively, in another implementation, similar to the aforementioned implementation of FIGS. 6A and 6B, the volume of the first contact structure CA may be larger than the volume of the second contact structure CB.

Meanwhile, although not shown, a resistivity of a material for forming first and second contact structures, which are coupled to first and second junction regions of the bit line switching element BL_SW and/or the word line switching element WL_SW of FIG. 2A, may be larger than a resistivity of a material for forming the second contact structure CB of the present implementation, and may be substantially the same as a resistivity of a material for forming the first contact structure CA of the present implementation.

The aforementioned implementations of FIGS. 3 to 7 may be implemented alone or in a combination of two or more of the implementations.

The above and other memory circuits or semiconductor devices based on the disclosed technology can be used in a range of devices or systems. FIGS. 8-12 provide some examples of devices or systems that can implement the memory circuits disclosed herein.

Figure 8:
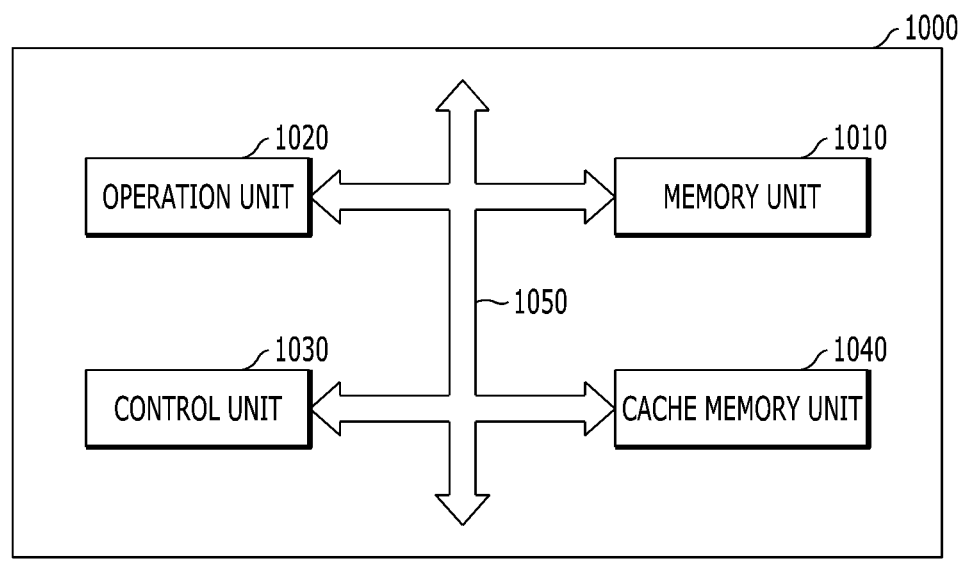
FIG. 8 is an example of a configuration diagram of a microprocessor implementing memory circuitry based on the disclosed technology.

FIG. 8 is an example of configuration diagram of a microprocessor implementing memory circuitry based on the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a first variable resistance element; a first switching element coupled to the first variable resistance element via a first line; a second variable resistance element; and a second switching element coupled to the second variable resistance element via a second line, wherein a distance between the first switching element and the first variable resistance element is larger than a distance between the second switching element and the second variable resistance element, and wherein a second path from a first terminal of the second switching element to the second variable resistance element includes a resistance component, a resistance of the second path being greater than a resistance of a first path, the first path being from a first terminal of the first switching element to the first variable resistance element. Through this, operating characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
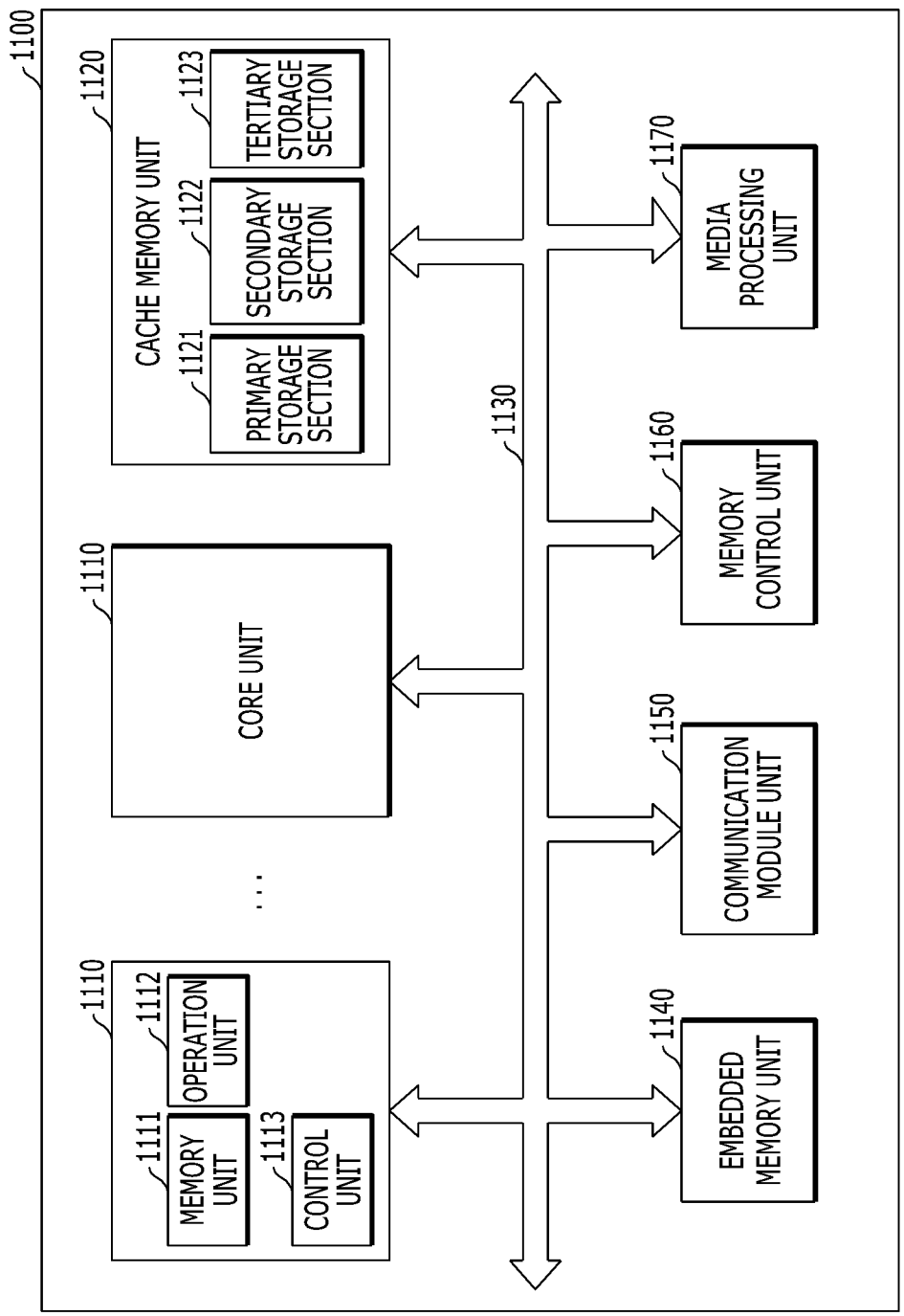
FIG. 9 is an example of a configuration diagram of a processor implementing memory circuitry based on the disclosed technology.

FIG. 9 is an example of configuration diagram of a processor implementing memory circuitry based on the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first variable resistance element; a first switching element coupled to the first variable resistance element via a first line; a second variable resistance element; and a second switching element coupled to the second variable resistance element via a second line, wherein a distance between the first switching element and the first variable resistance element is larger than a distance between the second switching element and the second variable resistance element, and wherein a second path from a first terminal of the second switching element to the second variable resistance element includes a resistance component, a resistance of the second path being greater than a resistance of a first path, the first path being from a first terminal of the first switching element to the first variable resistance element. Through this, operating characteristics of the cache memory unit 1120 may be improved. As a consequence, operating characteristics of the processor 1100 may be improved.

Although it was shown in FIG. 9 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
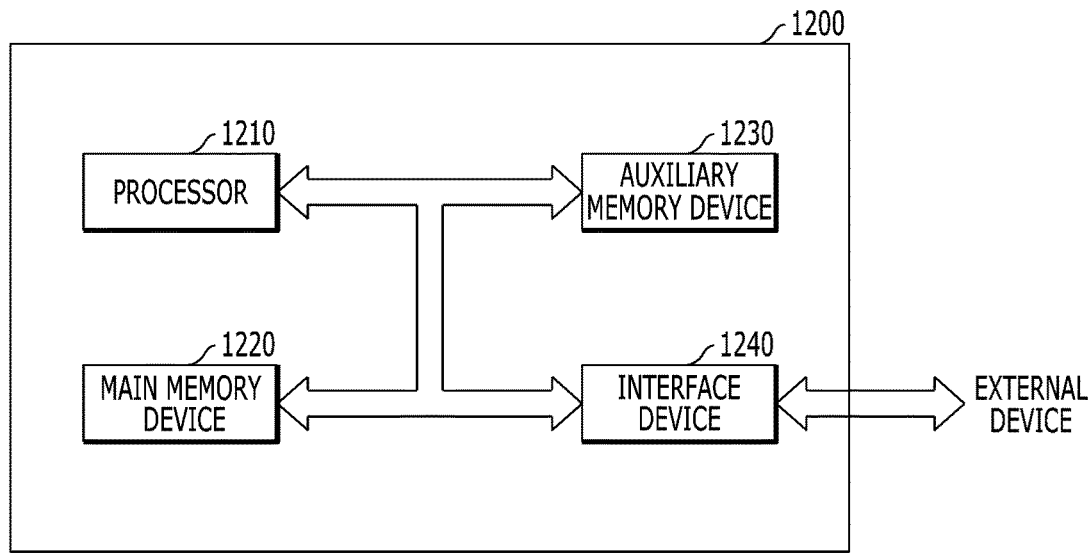
FIG. 10 is an example of a configuration diagram of a system implementing memory circuitry based on the disclosed technology.

FIG. 10 is an example of configuration diagram of a system implementing memory circuitry based on the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first variable resistance element; a first switching element coupled to the first variable resistance element via a first line; a second variable resistance element; and a second switching element coupled to the second variable resistance element via a second line, wherein a distance between the first switching element and the first variable resistance element is larger than a distance between the second switching element and the second variable resistance element, and wherein a second path from a first terminal of the second switching element to the second variable resistance element includes a resistance component, a resistance of the second path being greater than a resistance of a first path, the first path being from a first terminal of the first switching element to the first variable resistance element. Through this, operating characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a first variable resistance element; a first switching element coupled to the first variable resistance element via a first line; a second variable resistance element; and a second switching element coupled to the second variable resistance element via a second line, wherein a distance between the first switching element and the first variable resistance element is larger than a distance between the second switching element and the second variable resistance element, and wherein a second path from a first terminal of the second switching element to the second variable resistance element includes a resistance component, a resistance of the second path being greater than a resistance of a first path, the first path being from a first terminal of the first switching element to the first variable resistance element. Through this, the auxiliary memory device 1230 may be improved. As a consequence, operating characteristics of the system 1200 may be improved.

Also, the auxiliary memory device 1230 may further include a data storage system (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
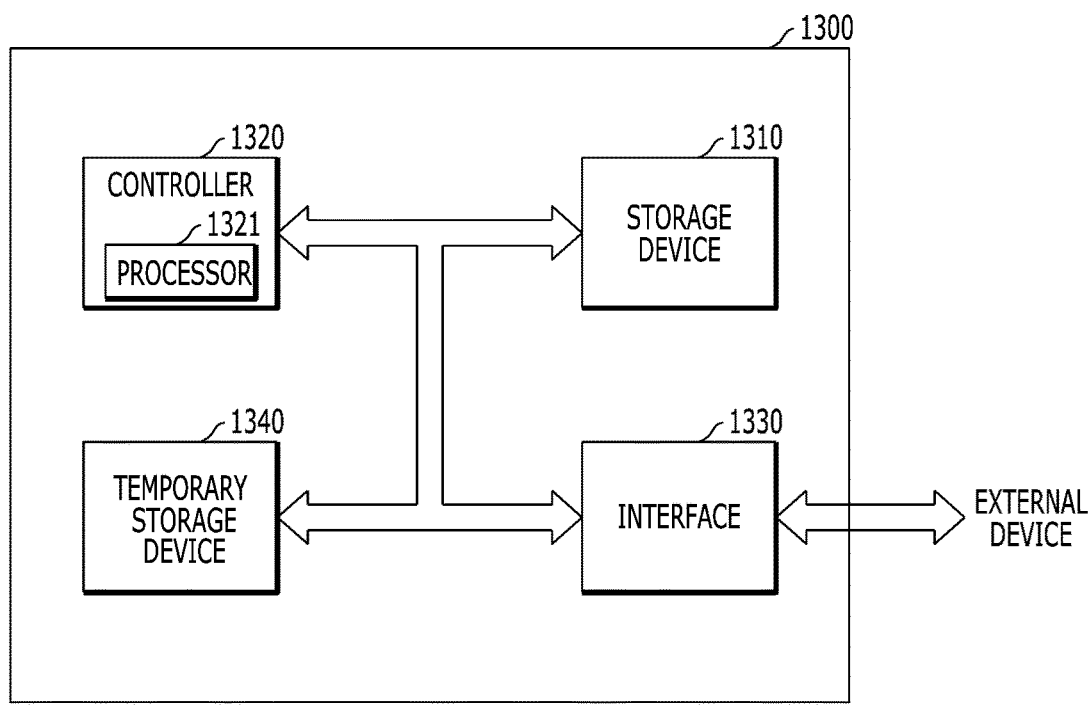
FIG. 11 is an example of a configuration diagram of a data storage system implementing memory circuitry based on the disclosed technology.

FIG. 11 is an example of configuration diagram of a data storage system implementing memory circuitry based on the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first variable resistance element; a first switching element coupled to the first variable resistance element via a first line; a second variable resistance element; and a second switching element coupled to the second variable resistance element via a second line, wherein a distance between the first switching element and the first variable resistance element is larger than a distance between the second switching element and the second variable resistance element, and wherein a second path from a first terminal of the second switching element to the second variable resistance element includes a resistance component, a resistance of the second path being greater than a resistance of a first path, the first path being from a first terminal of the first switching element to the first variable resistance element. Through this, operating characteristics of the storage device 1310 or the temporary storage device 1340 may be improved. As a consequence, operating characteristics of the data storage system 1300 may be improved.

Figure 12:
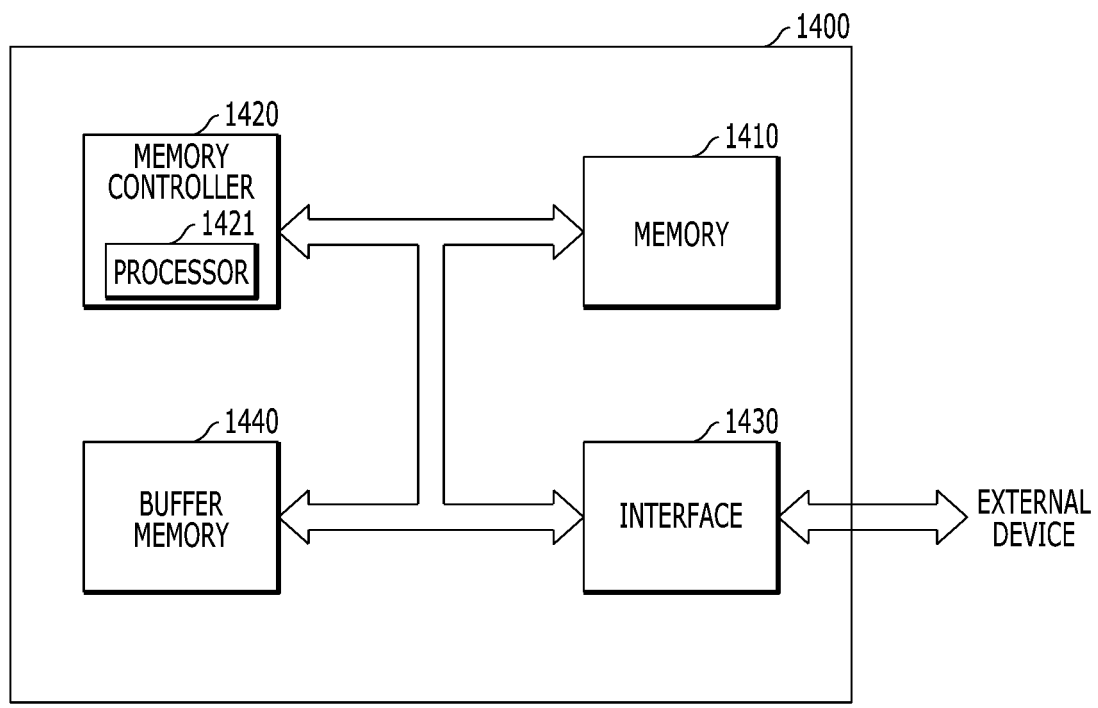
FIG. 12 is an example of a configuration diagram of a memory system implementing memory circuitry based on the disclosed technology.

FIG. 12 is an example of configuration diagram of a memory system implementing memory circuitry based on the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first variable resistance element; a first switching element coupled to the first variable resistance element via a first line; a second variable resistance element; and a second switching element coupled to the second variable resistance element via a second line, wherein a distance between the first switching element and the first variable resistance element is larger than a distance between the second switching element and the second variable resistance element, and wherein a second path from a first terminal of the second switching element to the second variable resistance element includes a resistance component, a resistance of the second path being greater than a resistance of a first path, the first path being from a first terminal of the first switching element to the first variable resistance element. Through this, operating characteristics of the memory 1410 may be improved. As a consequence, operating characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first variable resistance element; a first switching element coupled to the first variable resistance element via a first line; a second variable resistance element; and a second switching element coupled to the second variable resistance element via a second line, wherein a distance between the first switching element and the first variable resistance element is larger than a distance between the second switching element and the second variable resistance element, and wherein a second path from a first terminal of the second switching element to the second variable resistance element includes a resistance component, a resistance of the second path being greater than a resistance of a first path, the first path being from a first terminal of the first switching element to the first variable resistance element. Through this, operating characteristics of the buffer memory 1440 may be improved. As a consequence, operating characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:
1. An electronic device comprising a semiconductor memory,
   wherein the semiconductor memory comprises:
   a first variable resistance element;

a first switching element coupled to the first variable resistance element via a first line;
a second variable resistance element; and
a second switching element coupled to the second variable resistance element via a second line,
wherein a distance between the first switching element and the first variable resistance element is larger than a distance between the second switching element and the second variable resistance element,
wherein a second path from a first terminal of the second switching element to the second variable resistance element includes a resistance component, a resistance of the second path being greater than a resistance of a first path, the first path being from a first terminal of the first switching element to the first variable resistance element,
wherein the first switching element includes a first transistor having a first junction region corresponding to the first terminal of the first switching element,
wherein the second switching element includes a second transistor having a first junction region corresponding to the first terminal of the second switching element, and
wherein a concentration of impurities of the first junction region of the second switching element is lower than a concentration of impurities of the first junction region of the first switching element.

2. The electronic device according to claim 1, wherein the second transistor further includes a second junction region corresponding to a second terminal of the second switching element, and
wherein the concentration of the impurities of the first junction region of the second transistor is lower than a concentration of impurities of the second junction region of the second transistor.

3. The electronic device according to claim 1,
wherein an additional impurity doping region is disposed within the first junction region of the first switching element without being disposed within the first junction region of the second switching element.

4. The electronic device according to claim 3, wherein the second transistor further includes a second junction region corresponding to a second terminal of the second switching element, and
wherein an additional impurity doping region is disposed within the second junction region of the second transistor.

5. The electronic device according to claim 1,
wherein a first additional impurity doping region having a first impurity concentration is disposed within the first junction region of the first transistor, and a second additional impurity doping region having a second impurity concentration is disposed within the first junction region of the second transistor, the second impurity concentration being lower than the first impurity concentration.

6. The electronic device according to claim 5, wherein the second transistor further includes a second junction region corresponding to a second terminal of the second switching element, and
wherein a third additional impurity doping region is disposed within the second junction region of the second transistor, the third additional impurity doping region having the first impurity concentration.

7. An electronic device comprising a semiconductor memory,
wherein the semiconductor memory comprises:
a first variable resistance element;
a first switching element coupled to the first variable resistance element via a first line;
a second variable resistance element; and
a second switching element coupled to the second variable resistance element via a second line,
wherein a distance between the first switching element and the first variable resistance element is larger than a distance between the second switching element and the second variable resistance element,
wherein a second path from a first terminal of the second switching element to the second variable resistance element includes a resistance component, a resistance of the second path being greater than a resistance of a first path, the first path being from a first terminal of the first switching element to the first variable resistance element,
wherein the first switching element includes a first transistor having a first junction region corresponding to the first terminal of the first switching element,
wherein the second switching element includes a second transistor having a first junction region corresponding to the first terminal of the second switching element, and
wherein a number of first contact plugs disposed over and coupled to the first junction region of the first transistor is greater a number of second contact plugs disposed over and coupled to the first junction region of the second transistor.

8. The electronic device according to claim 7, wherein the second transistor further includes a second junction region corresponding to a second terminal of the second switching element, and
wherein a number of contact plugs disposed over and coupled to the second junction region of the second transistor is greater than the number of the second contact plugs disposed over and coupled to the first junction region of the second transistor.

9. An electronic device comprising a semiconductor memory,
wherein the semiconductor memory comprises:
a first variable resistance element;
a first switching element coupled to the first variable resistance element via a first line;
a second variable resistance element; and
a second switching element coupled to the second variable resistance element via a second line,
wherein a distance between the first switching element and the first variable resistance element is larger than a distance between the second switching element and the second variable resistance element,
wherein a second path from a first terminal of the second switching element to the second variable resistance element includes a resistance component, a resistance of the second path being greater than a resistance of a first path, the first path being from a first terminal of the first switching element to the first variable resistance element,
wherein the first switching element includes a first transistor having a first junction region corresponding to the first terminal of the first switching element,
wherein the second switching element includes a second transistor having a first junction region corresponding to the first terminal of the second switching element, and
wherein a volume of a first contact plug disposed over and coupled to the first junction region of the first transistor is larger than a volume of a second contact plug disposed over and coupled to the first junction region of the second transistor.

10. The electronic device according to claim 9, wherein the second transistor further includes a second junction region corresponding to a second terminal of the second switching element, and wherein a volume of a contact plug disposed over and coupled to the second junction region of the second transistor is larger than a volume of the second contact plug disposed over and coupled to the first junction region of the second transistor.

11. An electronic device comprising a semiconductor memory, wherein the semiconductor memory comprises:
a first variable resistance element;
a first switching element coupled to the first variable resistance element via a first line;
a second variable resistance element; and
a second switching element coupled to the second variable resistance element via a second line,
wherein a distance between the first switching element and the first variable resistance element is larger than a distance between the second switching element and the second variable resistance element,
wherein a second path from a first terminal of the second switching element to the second variable resistance element includes a resistance component, a resistance of the second path being greater than a resistance of a first path, the first path being from a first terminal of the first switching element to the first variable resistance element,
wherein the first switching element includes a first transistor having a first junction region corresponding to the first terminal of the first switching element,
wherein the second switching element includes a second transistor having a first junction region corresponding to the first terminal of the second switching element, and
wherein a resistivity of a first material included in a first contact structure disposed over and coupled to the first junction region of the first transistor is smaller than a resistivity of a second material included in a second contact structure disposed over and coupled to the first junction region of the second transistor.

12. The electronic device according to claim 11, wherein the second transistor further includes a second junction region corresponding to a second terminal of the second switching element, and wherein a resistivity of a material included in a contact structure disposed over and coupled to the second junction region of the second transistor is smaller than a resistivity of the second material included in the second contact structure disposed over and coupled to the first junction region of the second transistor.

13. The electronic device according to claim 11, wherein the first contact structure includes a stack structure of a plurality of first conductive patterns, wherein the second contact structure includes a stack structure of a plurality of second conductive patterns, the second conductive patterns being located to correspond to the first conductive patterns, respectively, in a stacking direction, and wherein a resistivity of a first pattern of the first conductive patterns is smaller than a resistivity of a second pattern of the second conductive patterns where the second pattern is located at the same level as the first pattern in the stacking direction.

14. The electronic device according to claim 11, wherein the first material includes W, and the second material includes TiN or TiAlN.

15. The electronic device according to claim 1, wherein the first variable resistance element is located between a first word line and a first bit line at an intersection region between the first word line and the first bit line, wherein the second variable resistance element is located between a second word line and a second bit line at an intersection region between the second word line and the second bit line, wherein the first switching element includes a first word line switching element coupled to the first variable resistance element via the first word line and a first bit line switching element coupled to the first variable resistance element via the first bit line, and wherein the second switching element includes a second word line switching element coupled to the second variable resistance element via the second word line and a second bit line switching element coupled to the second variable resistance element via the second bit line.

16. The electronic device according to claim 15, wherein the resistance component is located between the second word line switching element and the second variable resistance element, between the second bit line switching element and the second variable resistance element, or both.

17. The electronic device according to claim 15, wherein the semiconductor memory comprises a plurality of cell mats where each of the cell mats includes the first variable resistance element and the second variable resistance element, wherein the first and second word line switching elements are located between two cell mats, which are adjacent to each other in an extending direction of the first and second word lines, and wherein the first and second bit line switching elements are located between two cell mats, which are adjacent to each other in an extending direction of the first and second bit lines.

18. The electronic device according to claim 1, further comprising a data storage system which includes:

a storage device configured to store data and conserve stored data regardless of power supply;
a controller configured to control input and output of data to and from the storage device according to a command inputted from an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

19. The electronic device according to claim 1, further comprising a memory system which includes:

a memory configured to store data and conserve stored data regardless of power supply;
a memory controller configured to control input and output of data to and from the memory according to a command inputted from an outside;
a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

* * * * *